(12) United States Patent
Clem

(10) Patent No.: US 7,892,021 B2
(45) Date of Patent: Feb. 22, 2011

(54) LUMPED RESISTANCE ELECTRICAL CABLE

(75) Inventor: Jonathan D. Clem, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 248 days.

(21) Appl. No.: 11/952,092

(22) Filed: Dec. 6, 2007

(65) Prior Publication Data

US 2008/0079534 A1 Apr. 3, 2008

Related U.S. Application Data

(62) Division of application No. 11/430,396, filed on May 8, 2006, now Pat. No. 7,341,474.

(51) Int. Cl.
*H01R 12/24* (2006.01)
(52) U.S. Cl. .............. 439/497; 439/386; 439/947; 439/620.04; 439/620.24
(58) Field of Classification Search .......... 439/92, 439/109, 386, 424, 497, 620.04, 620.24, 439/947
See application file for complete search history.

(56) References Cited

U.S. PATENT DOCUMENTS

| | | | | |
|---|---|---|---|---|
| 4,075,608 A | * | 2/1978 | Koenig | 340/2.27 |
| 4,610,493 A | * | 9/1986 | Masek | 439/98 |
| 4,717,834 A | * | 1/1988 | Levy | 307/106 |
| 4,932,873 A | * | 6/1990 | La Shier | 439/76.1 |
| 4,973,263 A | * | 11/1990 | Nielsen | 439/438 |
| 5,556,300 A | * | 9/1996 | Parker | 439/497 |
| 5,649,829 A | * | 7/1997 | Miller et al. | 439/76.1 |
| 6,679,716 B2 | * | 1/2004 | Nakagawa et al. | 439/267 |
| 7,001,213 B2 | * | 2/2006 | Kaneko et al. | 439/579 |
| 7,341,474 B2 | * | 3/2008 | Clem | 439/424 |
| 2007/0105433 A1 | * | 5/2007 | Shioda et al. | 439/497 |
| 2007/0259561 A1 | * | 11/2007 | Clem | 439/425 |
| 2008/0079534 A1 | * | 4/2008 | Clem | 338/214 |

* cited by examiner

*Primary Examiner*—James Harvey
(74) *Attorney, Agent, or Firm*—William K. Bucher

(57) ABSTRACT

A lumped resistance electrical cable has a multiple twisted pair ribbon cable having first and second conductive lines and twisted and untwisted portions. In the untwisted portions, one of the conductive lines on each of the twisted pairs is formed with an electrical open. Resistor blocks having resistive elements and electrical contacts is disposed on the untwisted portions with the electrical contacts electrically coupling the resistive elements across the electrical opens in the conductive lines. Other electrical contacts in the connector couple the other conductive lines of the twisted pairs to an ground plane formed on the resistor block.

3 Claims, 7 Drawing Sheets

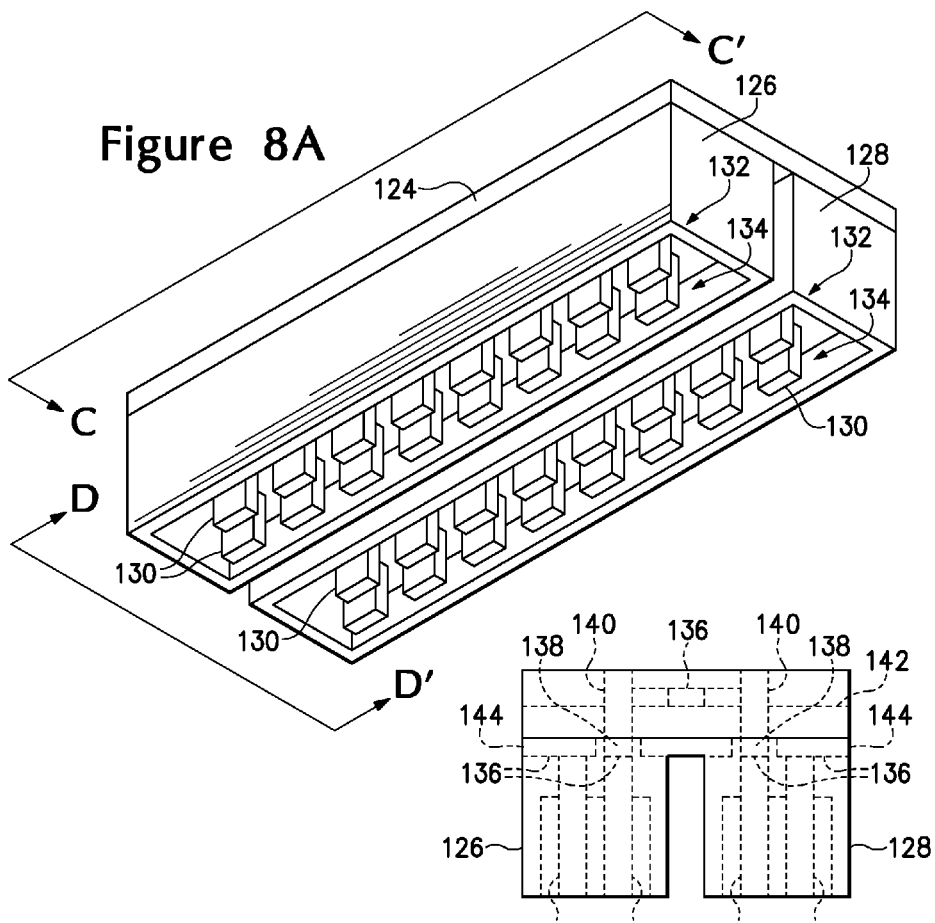
Figure 8A
Figure 8C
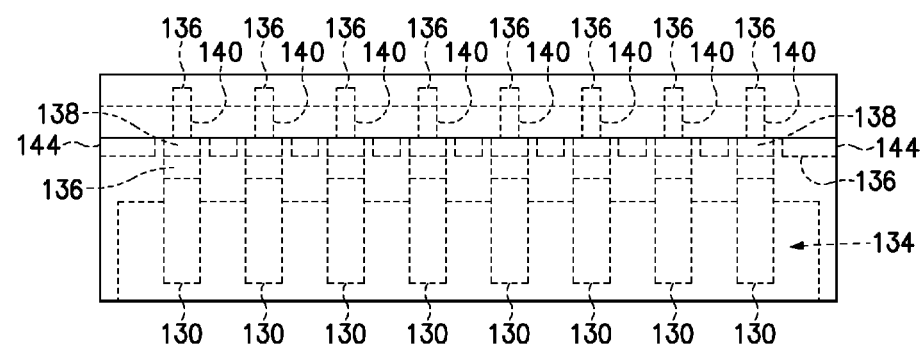
Figure 8B

LUMPED RESISTANCE ELECTRICAL CABLE

CROSS-REFERENCE TO RELATED APPLICATION

This U.S. divisional application claims the benefit of priority of co-pending U.S. patent application Ser. No. 11/430,396, filed May 8, 2006.

BACKGROUND OF THE INVENTION

The present invention relates generally to signal acquisition probe cables and more particularly to a lumped resistance electrical cable for use in voltage divide signal acquisition probes.

Currently available voltage divider signal acquisition probes use either nickel-chromium resistive signal wire to evenly distribute the required loss characteristics across the transmission line, or receiver circuitry disposed close enough to the probe input to eliminate transmission line effects. In the former case, the resistive signal wire lowers the circuit Q of the voltage divider input circuit of the probe to suppress signal oscillations. In the latter case, the receiver circuitry has a high input impedance to the circuit under test and a characteristic output impedance that matches the characteristic impedance of the transmission line, generally 50 ohms.

What is needed is an alternative signal acquisition probe electrical cable that has similar characteristics to the resistive signal wire currently in use. The signal acquisition probe electrical cable should facilitate multi-channel voltage divider signal acquisition probe construction. The signal acquisition probe should also use readily available commodity component technology.

SUMMARY OF THE INVENTION

Accordingly, the above needs are met with a lumped resistance electrical cable suitable for use in multi-channel voltage divider signal acquisition probes. The lumped resistance electrical cable has a ribbon cable having a plurality of twisted pair electrical lines with each twisted pair having first and second conductive lines. The twisted pair ribbon cable has at least one untwisted portion. One of first and second conductive lines of the twisted pair electrical lines in the untwisted portion has an electrical open formed therein. A resistor block is disposed on the untwisted portion of the of the twisted pair electrical lines. The resistor block has a housing with a first housing member having electrically conductive contacts extending therefrom and electrically coupled to each of the first and second conductive lines of the twisted pair electrical lines. The electrically conductive contacts are disposed on either side of the electrical opens in one of the first and second conductive lines and to the other of the first and second conductive lines. Resistive elements are electrically coupled to the electrically conductive contacts across the electrical opens. The housing has a second housing member fixedly mating with the first housing member to capture the untwisted portion of the twisted pair electrical lines between the two housing members.

The first housing member of the resistor block may be implemented with a recess therein for receiving the electrically conductive contacts mounted on a support member. The support member has resistive elements disposed thereon electrically coupled to the electrically conductive contacts on either side of the electrical opens. The resistive elements may be thick film resistors disposed on an intermediate surface in the support member and electrically coupled to the electrically conductive contacts via electrically conductive vias disposed in the support member. The resistive elements may also be discrete resistors electrically coupled to the electrically conductive contacts via electrically conductive vias disposed in the support member. A ground plane may be disposed on a surface of the support member and electrically coupled to the electrically conductive contacts electrically coupled to the other of the first and second conductive lines of the twisted pair electrical lines not having the electrical opens.

The lumped resistance electrical cable may also be implemented with a twisted pair ribbon cable having a plurality untwisted portions. In each of the untwisted portions, one of the conductive lines in each of the plurality of twisted pairs has an electrical open. Each of the untwisted portions of the twisted pair electrical lines has a resistor block disposed thereon. Each resistor block couples resistive elements across the electrical opens in the twisted pair electrical lines using the electrically conductive contacts. The other conductive lines are also coupled to the ground plane disposed on the support member using electrically conductive contacts.

The lumped resistance electrical cable is envisioned for use in a multi-channel voltage divider signal acquisition probe. In such an implementation, the lumped resistance electrical cable has an electrical connector disposed on one end of the ribbon cable having electrical contacts electrically coupled to each of the conductive lines of the plurality of twist pair electrical lines. A probing tip assembly is disposed on the other end of the ribbon cable having probing tips electrically coupled to each conductive lines of the plurality of twisted pair electrical lines. The probing tips has respective attenuation networks coupled to the signal lines of each of the twisted pair electrical lines where the signal lines have the series lumped resistance elements in the lines.

The lumped resistance electrical cable may further be implemented by connecting individual lumped resistance electrical cables together. In this implementation, a first electrical connector is disposed on one end of the twisted pair lumped resistance ribbon cable and a second electrical connector is disposed on the other end of the twisted pair lumped resistance ribbon cable with each connector having electrical contacts electrically coupled to each conductive line of the plurality of twist pair electrical lines. The first electrical connectors of the twisted pair lump resistance ribbon cables mate with and electrically couple to the second electrical connectors of the twisted pair lump resistance ribbon cables.

In still a further implementation of the lumped resistance electrical cable, electrical connectors are mounted on opposing ends of a plurality of twisted pair ribbon cables. A resistor block has first and second electrical connectors mounted on a substrate with each of the first and second electrical connectors having a plurality of electrically conductive contacts. Each of the electrically conductive contacts of the resistor block electrical connectors are electrically coupled to one of the electrically conductive contacts of the ribbon cable electrical connectors. The substrate has a plurality of resistive elements with each resistive element electrically coupled to a first set of the electrically conductive contacts of the resistor block connectors. The resistive elements are electrically coupled to one of the conductive lines of each of the twisted pair electrical lines via the electrically conductive contacts of the ribbon cable connectors. A second set of the electrically conductive contacts of the resistor block electrical connectors are electrically coupled to a ground plane formed on the substrate which are electrically coupled to the other of the conductive lines of each of the twisted pair electrical lines. Multiple resistor blocks can couple multiple twisted pair ribbon cables together to form a longer cable having multiple lumped resistances along the cable.

The objects, advantages and novel features of the present invention are apparent from the following detailed description when read in conjunction with appended claims and attached drawings.

BRIEF DESCRIPTION OF THE DRAWINGS

FIG. 8A through 8C are various views of the resistor block mountable on the twisted pair ribbon cable in the lumped resistance electrical cable.

DETAILED DESCRIPTION OF THE INVENTION

The lumped resistance electrical cable to be described incorporates insulation displacement technology (IDC) commonly used in the computer industry. The technology uses an IDC ribbon cable and matching IDC connectors. IDC technology displaces or pushes aside some of the insulation around the cable conductors or wires using staggered electrically conductive contacts having pointed jaws with a narrow slot down the center. The pointed jaws penetrate the insulation around the wires with the wires making a direct electrical connection in the slot between the jaws of the electrically conductive contacts.

Figure 1:
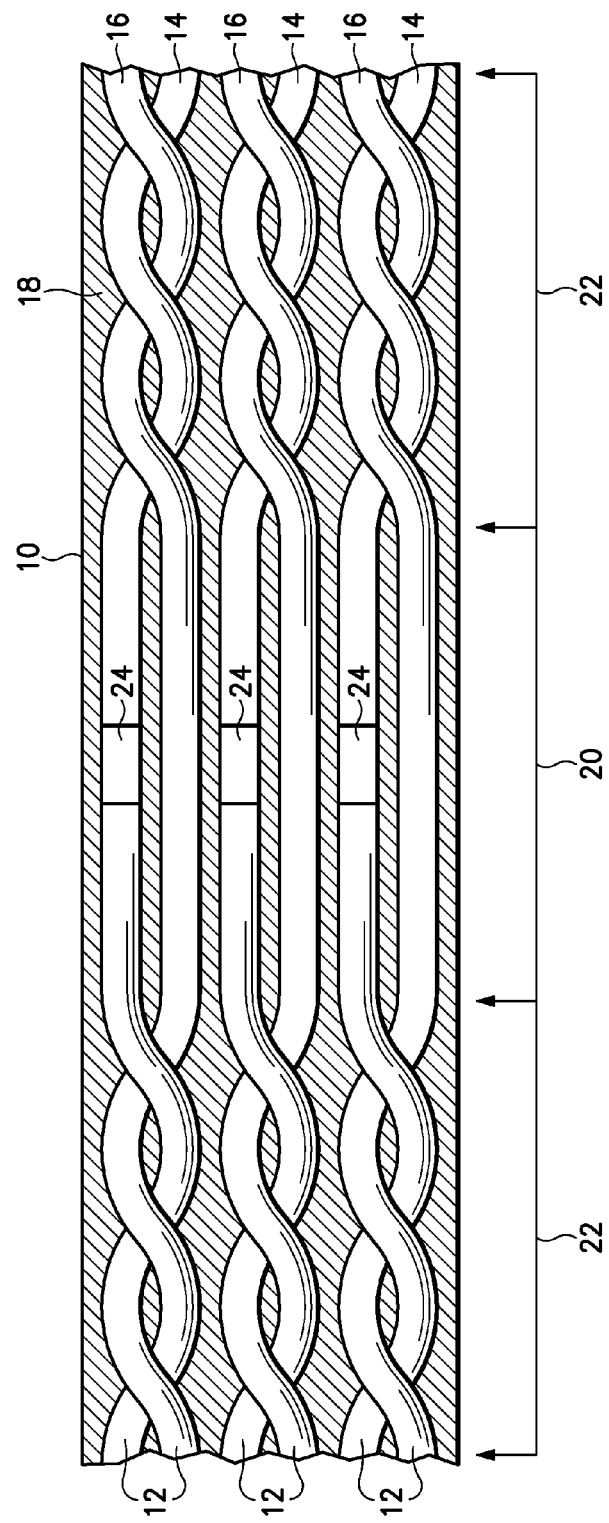
FIG. 1 is a plan view of a portion of a twisted pair ribbon cable for use in the lumped resistance electrical cable.

Referring to FIG. 1, there is illustrated a plan view of an IDC ribbon cable 10 modified for use in the lumped resistance electrical cable. The ribbon cable 10 has a plurality of twisted pair electrical lines 12 with each twisted pair having first and second conductive lines 14 and 16. The twisted pair electrical lines 12 are surrounded by insulating material 18. The twisted pair ribbon cable 10 is designed with at least a first untwisted flat portion 20 interposed between twisted pair portions 22. The twisted pair electrical lines 12 in the untwisted flat portion 20 are arranged parallel to each other. For use in the lumped resistance electrical cable, one of the conductive lines 14 or 16 of each of the twisted pair electrical lines 12 has a section of the wire removed in the flat portion 20 of the ribbon cable 10 forming an electrical open 24 in the conductive line 14 or 16. While FIG. 1 illustrates 3 twisted pair electrical lines 12 in the ribbon cable 10, the lumped resistance electrical cable is not limited to a specific number of twisted pair electrical lines 12 and ribbon cables 10 having more or less twisted pair electrical lines 12 are contemplated for use with the lumped resistance electrical cable.

Figure 2:
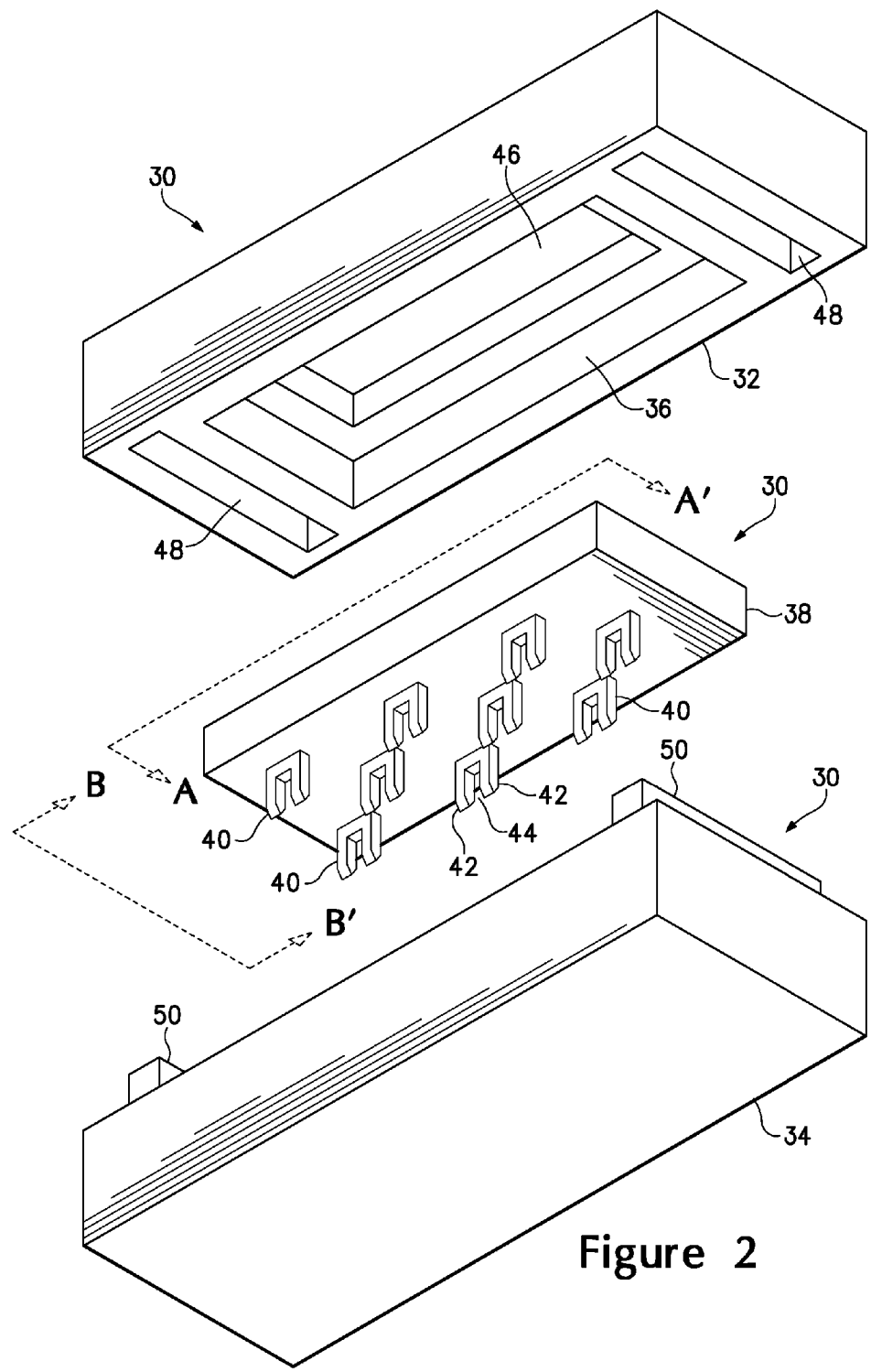
FIG. 2 is an exploded perspective view of the resistor block for use in the lumped resistance electrical cable.

Referring to FIG. 2, there is illustrated a resistor block 30 mountable on the untwisted flat portions 20 of the twisted pair ribbon cable 10. The resistor block 30 has a housing with a first housing member 32 that is positioned on one side of the twisted pair ribbon cable 10 and a second housing member 34 positioned on the other side of the ribbon cable 10 and mates with the first housing member 32 to capture the ribbon cable 10 between the two housing members 32 and 34. The first housing member 32 has a recess 36 formed therein that receives a support member 38 that secures electrically conductive contacts 40. The support member 38 may be formed of circuit board material or similar laminated insulated board material that is suitable for receiving electrical components. The electrically conductive contacts 40 are IDC type contacts having pointed piercing members 42 separated by a slot 44. The electrically conductive contacts 40 are positioned in the support member 38 to align with the conductive lines 14 and 16 of the twisted pair electrical lines 14. The recess 36 may be formed with a further recess 46 that allows discrete resistive elements to be positioned on the top surface of the support member 38 which will discussed in greater detail below. The first housing member 32 may also include recesses 48 that accept tabs 50 formed on the second housing member 34. The recesses 48 and the tabs 50 may be secured together using an adhesive, such as epoxy, sonic welding or the like. Alternately, the recesses 48 and tabs 50 may be formed with latching mechanisms that engage each other when the tabs 50 are inserted into the recesses 48. In a further alternative, the first and second housing members 32 and 34 may be secured with screws that are inserted into apertures formed in the second housing member 34 and screwed into threaded apertures in the first housing member 32.

Figure 3:
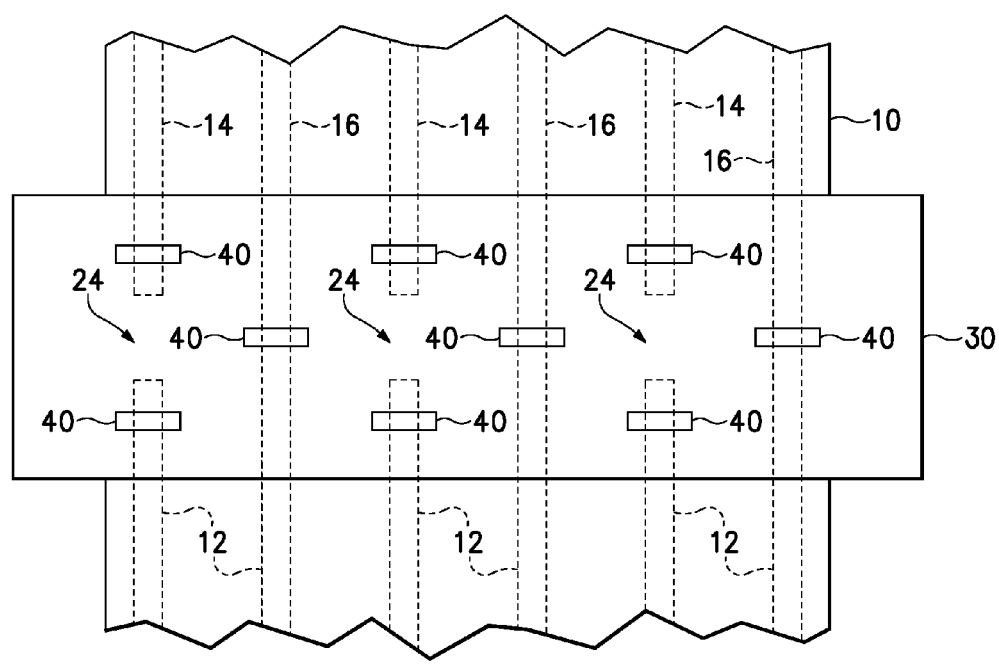
FIG. 3 is a plan view illustrating the resistor block mounted to the twisted pair ribbon cable in the lumped resistance electrical cable.

Referring to FIG. 3, there is illustrated a plan view of the resistor block 30 positioned on the twisted pair ribbon cable 10. Like elements from the previous drawings are labeled the same in FIG. 3. The plan view shows electrically conductive contacts 40 disposed on either side of the electrical opens 24 in conductive lines 14 of the twisted pair electrical lines 12 and electrically coupled to the conductive lines 14. The plan view also show electrically conductive contacts 40 disposed on and electrically coupled to the other conductive line 16 of the twisted pair electrical lines 12. Preferably, the electrically conductive contacts 40 disposed on the conductive lines 16 are laterally offset from the electrically conductive contacts 40 disposed on conductive lines 14.

Figure 4A:
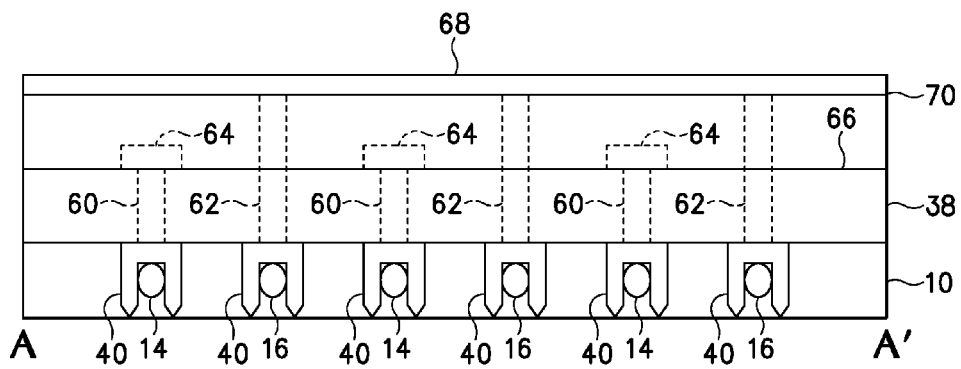
FIGS. 4A through 4C are various views of the resistor block mounted on the twisted pair ribbon cable in the lumped resistance electrical cable.
Figure 4B:
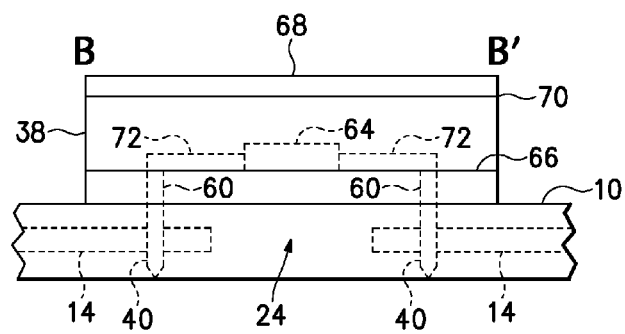
Figure 4C:
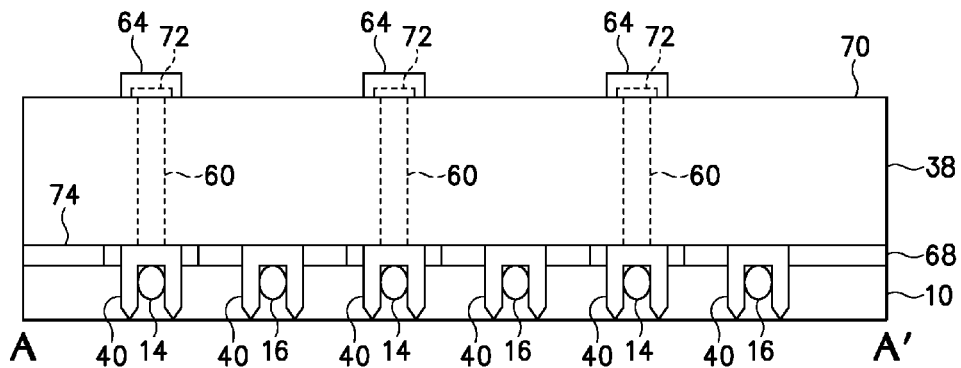

FIGS. 4A through 4C are various side views of the support member 38 mounted on the twisted pair ribbon cable 10. Like elements from the previous drawings are labeled the same in FIGS. 4A through 4C. FIG. 4A shows a side view of the support member 38 and the twisted pair ribbon cable 10 along line A-A'. The electrically conductive contacts 40 are shown having pierced the twisted pair ribbon cable 10. The conductive lines 14 and 16 of the twisted pair electrical lines 12 are disposed in the slots 44 of the electrically conductive contacts 40. The support member 38 has electrically conductive vias 60 and 62 for coupling the electrically conductive contacts 40 to electrical elements of the support member 38. Vias 60 electrically coupled the electrically conductive contacts 40 coupled to the twisted pair conductive lines 14 to resistive elements 64 formed on an intermediate surface 66 of the support member 38. In this implementation, the resistive elements 64 are thick film resistors formed using well known thick film processes. Vias 62 electrically couple a ground plane 68 formed on the top surface 70 of the support member 38 to the electrically conductive contacts 40 coupled to twisted pair conductive lines 16. Since, blind vias, such as those that extend partially through the substrate are more expensive to produce than through hole vias, the vias 60 are preferably through hole vias isolated from the ground plane 68.

FIG. 4B shows a side view of the support member and twisted pair ribbon cable 10 along lined B-B'. The electrically conductive contacts 40 are shown having pierced the twisted pair ribbon cable 10 with the electrically conductive contacts 40 electrically coupled to the conductive line 14 on either side of the electrical open 24. The electrically conducive vias 60 couple the electrically conductive contacts 40 to electrically conductive traces 72 formed on the intermediate surface 66 of the support member 38. The electrically conductive traces 72 are electrically coupled to the thick film resistive element 64 formed on the intermediate surface 66. The resulting electrical circuit bridges the electrical opens 24 in the conductive lines 14 using the resistive element 64.

FIG. 4C shows a side view of an alternative implementation of the support member 38 and the twisted pair ribbon cable 10 along line A-A'. The electrically conductive contacts 40 are shown having pierced the twisted pair ribbon cable 10. The conductive lines 14 and 16 of the twisted pair electrical lines 12 are disposed in the slots 44 of the electrically conductive contacts 40. In this implementation, the support member 38 has electrically conductive vias 60 for electrically coupling the electrically conductive contacts 40 to resistive elements 64 disposed on the top surface 70 of the support member 38. The intermediate surface 66 is not present in this implementation. In this implementation, the resistive elements 64 are discrete resistors electrically coupled to the vias via electrically conductive traces 72 formed on the top surface 70 The ground plane 68 is formed on the bottom surface 74 of the support member 38 from which the electrically conductive contacts 40 extend. The ground plane 68 is electrically coupled to the electrically conductive contacts 40 that engage the conductive lines 16 of the twisted pair electrical lines 12. The electrically conductive contacts 40 that engage the conductive line 14 of the twisted pair electrical lines 12 are insulated from the ground plane 68.

Figure 5:
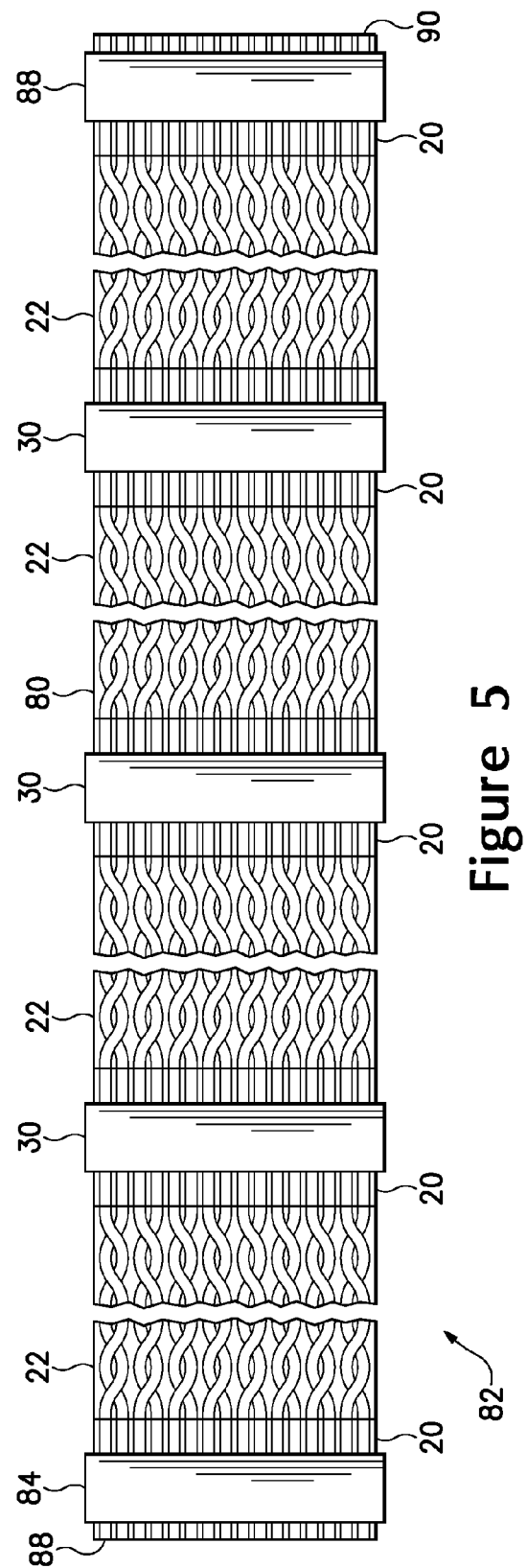
FIG. 5 is a plan view of the lumped resistance electrical used in a multi-channel voltage divider signal acquisition probe.

Referring to FIG. 5, there is shown a plan view of the lumped resistance electrical cable 80 used with a multi-channel voltage divide signal acquisition probe 82. The lumped resistance electrical cable 80 has the twisted pair ribbon cable 10 with the flat untwisted portions 20 and twisted portions 22. The flat untwisted portion 20 at one end of the twisted pair ribbon cable 10 has a electrical connector 84 mounted thereon. The electrical connector 84 has electrical contacts 86 with each electrical contact 86 electrically coupled to one of the conductive lines 14 and 16 of the twisted pair electrical lines 12. The flat untwisted portion 20 at the other end of the twisted pair ribbon cable 10 has a probing tip assembly 88 mounted thereon. The probing tip assembly 88 has probing tips 90 with each probing tip electrically coupled to one of the conductive lines 14 and 16 of the twisted pair electrical lines 12. The conductive lines 14 with the series coupled resistive elements 64 are electrically coupled to the probing tips via individual attenuator networks of multi-channel voltage divider signal acquisition probe 82. The intermediate flat portions 20 of the twisted pair ribbon cable 10 have the resistor blocks 30 mounted thereto with the resistive elements 64 of the resistive blocks 30 coupling the resistive elements 64 in series with the conductive lines 14 of the twisted pair electrical lines 12.

Figure 6:
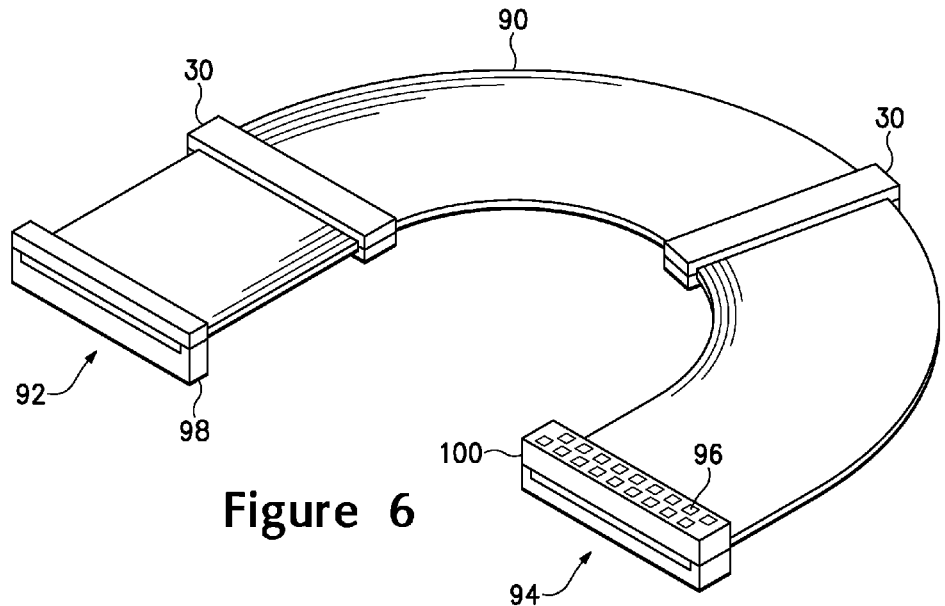
FIG. 6 is a perspective view of electrical connectors mounted on the ends of the lumped resistance electrical cable.

Referring to FIG. 6, there is shown an alternative to the lumped resistance electrical cable 80 of FIG. 5. Instead of one long lumped resistance electrical cable 80 with a probing tip assembly 88 and an electrical connector 86 mounted on either end, this implementation envisions a series of smaller lumped resistance electrical cables 90 with resistive blocks 30 mounted on a smaller number of intermediate flat portions of the twisted pair ribbon cable 10 and electrical connectors 92 and 94 mounted on either end of the ribbon cable 10. The electrical connectors 92 and 94 have electrical contacts 96 with each electrical contact 96 electrically coupled to one of the conductive lines 14 and 16 of the twisted pair electrical lines 12. The electrical connectors 92 and 94 have housings 98 and 100 which mate with each other to secure one lumped resistance electrical cable 90 to another. When mated together, the electrical contacts 96 of electrical connector 92 mounted on one lumped resistance electrical cable 90 electrically engages the electrical contacts 96 of electrical connector 94 mounted on another lumped resistance electrical cable 90. In such an implementation, one of the lumped resistance electrical cables 90 has the probing tip assembly 88.

Figure 7:
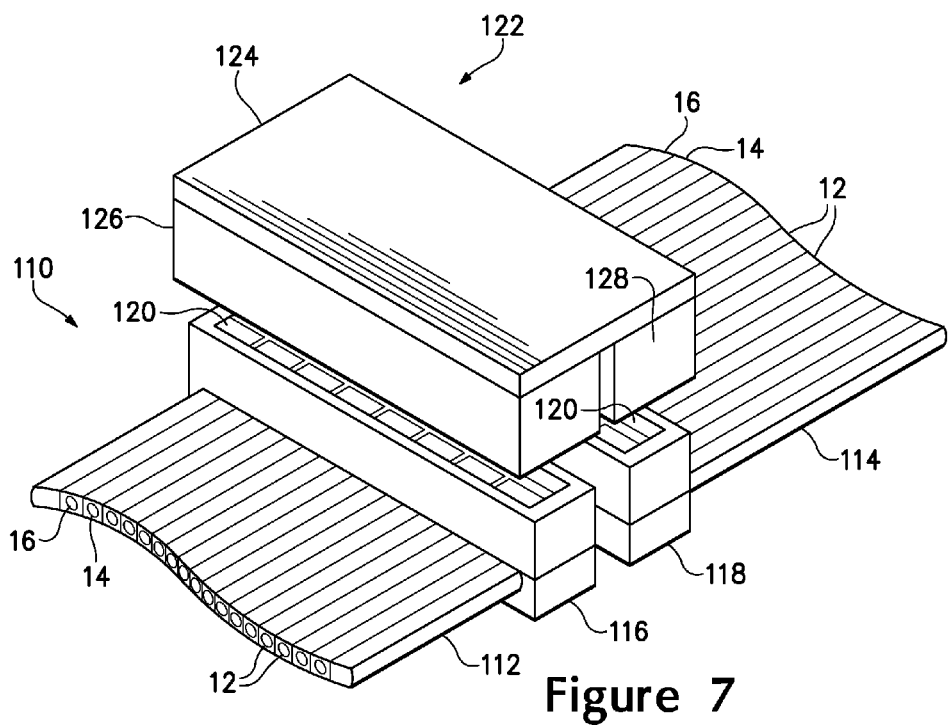
FIG. 7 is a perspective view of a further embodiment of the lumped resistance electrical cable.

FIG. 7 is a perspective view of a further embodiment of the lumped resistance electrical cable 110. Like elements from previous drawing are labeled the same in FIG. 7. Twisted pair ribbon cables 112 and 114 are terminated in IDC type electrical connectors 116 and 118. Each of the conductive lines 14 and 16 of the twisted pair electrical lines 12 is coupled to one of the electrical contacts disposed in apertures 120 formed in the electrical connectors 116 and 118. A resistor block 122 has a substrate 124 and electrical connectors 126 and 128 that mate with the connectors 116 and 118. The substrate 124 has resistive elements formed therein electrically coupled to electrically conductive contacts in the electrical connectors 126 and 128. These electrically conductive contacts in turn mate with electrically conductive contacts in the electrical connectors 116 and 118 that are electrically coupled to one of the conductive lines 14 and 16 of the twisted pair electrical lines 12. The substrate 124 also has a ground plane electrically coupled to other electrically conductive contacts in the electrical connectors 126 and 128. These electrically conductive contact in turn mate with other electrically conductive contacts in the electrical connectors 116 and 118 that are electrically coupled to the other of the conductive lines 14 and 16 of the twisted pair electrical lines 12.

FIGS. 8A through 8C illustrate various views of the resistor block 122. FIG. 8A is a perspective view of the resistor block 122 illustrating the electrically conductive contacts 130. Like elements from the previous drawing are labeled the same in FIG. 8. Each electrical connector 126 and 128 has a housing 132 in which are disposed the electrically conductive contacts 130 in parallel and offset rows 132 and 134. The parallel rows 132 and 134 of electrically conductive contacts 130 mate with the corresponding electrically conductive contacts in the apertures 120 in the electrical connectors 116 and 118. The electrically conductive contacts 130 may extend through the housing 132 and form contacts pads 136 on top of the housing or the electrically conductive contacts 130 may be electrically coupled to electrically conductive leads extending from the respective housing that are soldered to contact pads on the substrate 124. The contact pads 136 of the electrically conductive contacts 130 are electrically coupled to contact pads 138 formed on the substrate 124. The substrate 124 may be formed of circuit board material or similar laminated insulated board material that is suitable for receiving electrical components. Preferably, the electrically conductive contacts 130 of the inner rows 134 of each of the electrical connectors 126 and 128 are electrically coupled to one of a number of resistive elements 136 disposed on an intermediate surface of the substrate 124 via the vias 140 formed in the substrate 124 as best illustrated by the side views of the resistor block 122 long lines C-C' and D-D' in FIGS. 8B and 8C. The vias 140 extend at least to an intermediate surface 142 in the substrate 124 where a series of resistive elements 136 are formed use thick film processing or the like. As previously stated blind vias are more expensive to produce than through hole vias so the vias 140 are preferably through hole vias as represented in FIG. 8C. Each resistive element 136 is electrically coupled between the opposing vias 140 that are electrically coupled to aligned electrically conductive contacts 130 in the rows 134 of the electrical connectors 126 and 128. A ground plane 144 of formed on the surface of the substrate 124 adjacent to the electrical connectors 126 and 128. The outer rows 132 of the electrically conductive contacts 130 of each of the electrical connectors 126 and 128 are electrically coupled to the ground plane 144. Alternately, the ground plane 144 may be formed on the top surface 146 of the substrate 124 with the outer rows 132 of the electrically conductive contacts 130 of each of the electrical connectors 126 and 128 be coupled to the ground plane 144 via through hole vias formed in the substrate 124.

The resistor block 122 is connected to the twisted pair ribbon cables 112 and 114 with the resistor block electrical connectors 126 and 128 mating with the electrical connectors 116 and 118 mounted on the twisted pair ribbon cables 112 and 114. The electrically conductive contacts 130 of the outer rows 132 of the electrical connectors 126 and 128, which are electrically coupled to the ground plane 144 of the substrate, are electrically coupled to corresponding electrically conductive contacts in the apertures 120 of the electrical connectors 116 and 118. These electrically conductive contacts, in turn, are electrically coupled to conductive lines 16 of each of the twisted pair electrical lines 12. The electrical continuity of these sets of electrical lines 16 are maintained across the resistor block 122. The electrically conductive contacts 130 of the inner rows 134 of the electrical connectors 126 and 128, which are electrically coupled to respective resistive elements 136 in the substrate 124, are electrically coupled to corresponding electrically conductive contacts in the apertures 120 of the electrical connectors 116 and 118. These electrically conductive contacts, in turn, are electrically coupled to conductive lines 14 of each of the twisted pair electrical lines 12. Each of the respective resistive elements 136 in the resistor block 122 provides a series lumped resistance within the conductive lines 14 of the twisted pair electrical lines 12. Multiple twisted pair ribbon cables 112, 114 may be joined together with resistive blocks 122 to form a longer twisted pair ribbon cable having lumped resistances along the length of the cable.

It will be obvious to those having skill in the art that many changes may be made to the details of the above-described embodiments of this invention without departing from the underlying principles thereof. The scope of the present invention should, therefore, be determined only by the following claims.

What is claimed is:

1. A lumped resistance electrical cable comprising:
at least first and second ribbon cables with each ribbon cable having a plurality of twisted pair electrical lines with each of the twisted pair electrical lines having first and second conductive lines;
at least first and second electrical connectors with one of the first and second electrical connectors mounted on one end of the first ribbon cable and the second electrical connector mounted on one end of the second ribbon cable, each electrical connector having a plurality of electrically conductive contacts with each electrically conductive contact electrically coupled to one of the conductive lines of one of the first and second ribbon cables; and
a resistor block having first and second electrical connectors mounted on a substrate with each of the first and second electrical connectors having a plurality of electrically conductive contacts with each of the electrically conductive contacts of the resistor block first and second electrical connectors electrically coupled to one of the electrically conductive contacts of the ribbon cable first and second electrical connectors, and the substrate having a plurality of resistive elements with each resistive element electrically coupled to a first set of the electrically conductive contacts of the first and second resistor block connectors which are electrically coupled to one of the conductive lines of each of the twisted pair electrical lines, and second set of the electrically conductive contacts of the first and second resistor block electrical connectors electrically coupled to a ground plane formed on the substrate which are electrically coupled to the other of the conductive lines of each of the twisted pair electrical lines.

2. The lumped resistance electrical cable as recited in claim 1 further comprising a probing tip assembly disposed on an opposite end of one of the first and second ribbon cables having probing tips electrically coupled to each of the first and second conductive lines of the plurality of twisted pair electrical lines and a further electrical connector mounted on an opposite end of the other of the first and second ribbon cables.

3. The lumped resistance electrical cable as recited in claim 2 further comprising a plurality of ribbon cables with each ribbon cable having a plurality of twisted pair electrical lines with each of the twisted pair electrical lines having first and second conductive lines and each of the plurality of ribbon cables having at least first and second electrical connectors with each electrical connector having a plurality of electrically conductive contacts with each electrically conductive contact electrically coupled to one of the conductive lines of the twisted pair electrical lines and a plurality of resistor blocks with each resistor block electrically coupled to one of the electrical connectors of a least two of the plurality of ribbon cables.

* * * * *